(12) United States Patent
Shim et al.

(10) Patent No.: US 12,079,465 B2
(45) Date of Patent: Sep. 3, 2024

(54) ELECTRONIC DEVICE FOR RECEIVING AND DISPLAYING APPLICATION SCREEN FROM EXTERNAL DEVICE AND METHOD FOR CONTROLLING SAME

(71) Applicant: SAMSUNG ELECTRONICS CO., LTD., Suwon-si (KR)

(72) Inventors: Huijun Shim, Suwon-si (KR);
Gwanhyung Kim, Suwon-si (KR);
Yeongjun Kwon, Suwon-si (KR);
Kyeong Namkoong, Suwon-si (KR);
Changmin Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/202,710

(22) Filed: May 26, 2023

(65) Prior Publication Data
US 2023/0384927 A1 Nov. 30, 2023

Related U.S. Application Data

(63) Continuation of application No. PCT/KR2023/002651, filed on Feb. 24, 2023.

(30) Foreign Application Priority Data

May 25, 2022 (KR) .................. 10-2022-0064370
Aug. 5, 2022 (KR) .................. 10-2022-0098114

(51) Int. Cl.
G06F 3/042 (2006.01)
G06F 3/041 (2006.01)
G06F 3/04883 (2022.01)

(52) U.S. Cl.
CPC ...... *G06F 3/04883* (2013.01); *G06F 3/04162* (2019.05); *G06F 3/0421* (2013.01); *G06F 2203/04105* (2013.01)

(58) Field of Classification Search
CPC ............ G06F 3/03545; G06F 3/04146; G06F 3/04162; G06F 3/0421; G06F 3/0442; G06F 3/04883; G06F 2203/04105
See application file for complete search history.

(56) References Cited

U.S. PATENT DOCUMENTS 5,633,471 A 5/1997 Fukushima
9,035,920 B2 5/2015 Stern
(Continued)

FOREIGN PATENT DOCUMENTS

CN 103425294 A 12/2013
JP 2014-174666 A 9/2014
(Continued)

OTHER PUBLICATIONS

International Search Report dated Jun. 8, 2023, issued by the International Searching Authority in counterpart International Application No. PCT/KR2023/002651 (PCT/ISA/210).
(Continued)

*Primary Examiner* — Joe H Cheng
(74) *Attorney, Agent, or Firm* — Sughrue Mion, PLLC

(57) ABSTRACT

An electronic device for receiving and displaying an application screen from an external device, includes: a display including a touch sensor; a communication interface; and at least one processor configured to: control the display to display a first application screen received from the external device through the communication interface and a writing pressure adjustment user interface (UI), transmit, to the external device, information on a writing pressure value set through the writing pressure adjustment UI and a touch input identified through the touch sensor, receive, from the external device through the communication interface, a second application screen including a touch trajectory identified based on the information on the writing pressure value and
(Continued)

the touch input, and control the display to display the received second application screen.

15 Claims, 20 Drawing Sheets

(56) References Cited

U.S. PATENT DOCUMENTS

| | | | |
|---|---|---|---|
| 9,946,365 B2 | 4/2018 | Cueto | |
| 10,901,537 B2 | 1/2021 | Tamura | |
| 11,048,379 B2* | 6/2021 | Cheong | H04M 1/0268 |
| 11,099,863 B2* | 8/2021 | Klein | G06F 9/44505 |
| 2014/0059428 A1 | 2/2014 | Jeong et al. | |
| 2016/0147434 A1* | 5/2016 | Lee | G06F 3/0482 |
| | | | 715/838 |
| 2018/0203566 A1 | 7/2018 | Kawasaki | |
| 2019/0310755 A1* | 10/2019 | Sasaki | G06F 3/044 |
| 2020/0125189 A1* | 4/2020 | Kim | G01J 3/46 |
| 2020/0167033 A1 | 5/2020 | Kim et al. | |
| 2021/0090457 A1 | 3/2021 | Deegan | |
| 2022/0066589 A1* | 3/2022 | Gilra | G06F 3/0416 |
| 2023/0410393 A1* | 12/2023 | Zhou | G06F 3/0488 |

FOREIGN PATENT DOCUMENTS

| | | | |
|---|---|---|---|
| JP | 2019-139788 A | | 8/2019 |
| JP | 2020-91629 A | | 6/2020 |
| KR | 10-2014-0026723 A | | 3/2014 |
| KR | 10-2018-0131817 A | | 12/2018 |
| KR | 20180131817 A | * | 12/2018 |
| KR | 10-2020-0062812 A | | 6/2020 |
| KR | 10-2021-0023434 A | | 3/2021 |
| KR | 10-2383022 B1 | | 4/2022 |

OTHER PUBLICATIONS

Written Opinion dated Jun. 8, 2023, issued by the International Searching Authority in counterpart International Application No. PCT/KR2023/002651 (PCT/ISA/237).

* cited by examiner

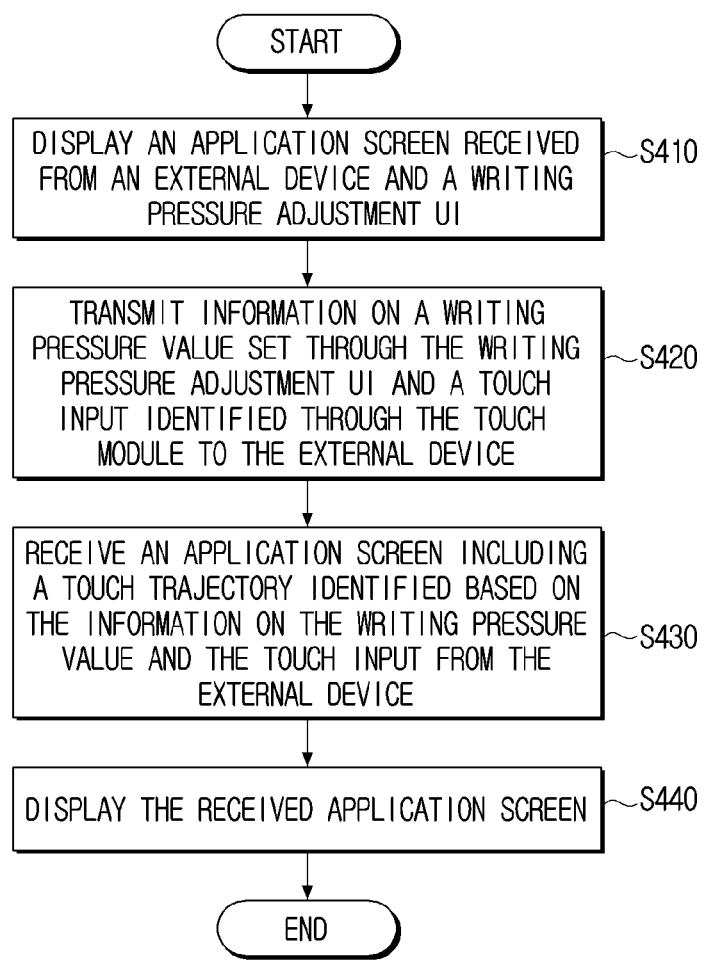

ELECTRONIC DEVICE FOR RECEIVING AND DISPLAYING APPLICATION SCREEN FROM EXTERNAL DEVICE AND METHOD FOR CONTROLLING SAME

CROSS-REFERENCE TO RELATED APPLICATIONS

This application is a continuation application of International Application No. PCT/KR2023/002651, filed on Feb. 24, 2023, which claims priority to Korean Patent Application No. 10-2022-0064370, filed on May 25, 2022, and Korean Patent Application No. 10-2022-0098114, filed on Aug. 5, 2022, the disclosures of which are incorporated herein by reference in their entireties.

BACKGROUND

1. Field

The disclosure relates to an electronic device and a method for controlling the same, and more particularly, to an electronic device that receives a touch input, and a method for controlling the same.

2. Description of Related Art

A device with a touch screen is configured to identify a location that a user contacts the touch screen. Recently, a touch screen is being widely used not only for various mobile devices such as an MP3 player, a navigation, a portable media player (PMP), etc. as well as a mobile phone, but also for a large size display such as an electronic board.

Detecting a writing pressure value on a touch screen may be performed by an active method detecting an electronic pen. Detecting a writing pressure value on a touch screen may also be performed by placing a piezoelectric sensor into a panel end.

An electronic pen operating according to an active method, converts a resistance value or changes a capacitance as a sensor by a piezoelectric method is put into the pen-tip part, and can transmit a writing pressure value by carrying the changed value in a touch signal or through communication. In case a piezoelectric sensor is put into a panel end, pressing of the panel is detected by the piezoelectric sensor and the pushing force is converted into an electronic signal, and a writing pressure can thereby be detected.

In case a writing pressure sensor is included in an electronic pen itself, a structure for measuring a writing pressure needs to be put into at least a thin portion of a pen, and thus, tool complexity increases. Furthermore, as a measured writing pressure should be transmitted by being included in a touch signal, or transmitted to a touch screen by using communication, a battery is needed. Therefore, for this, there is inconvenience of having to charge the battery frequently or replace the battery.

In the case of putting a piezoelectric sensor into a panel, it is difficult to detect a small force as the size gets too large. Furthermore, it is difficult to correctly measure a writing pressure value depending on locations. Moreover, in case a different force other than a device for measuring a writing pressure is additionally transmitted, it is difficult to measure the writing pressure. For example, in case a signal is input into the panel with a pen and a palm contacts the panel, a different force from the case of using only the pen is applied, and thus, there is a problem that the correct writing pressure is not measured.

SUMMARY

According to an aspect of the disclosure, an electronic device for receiving and displaying an application screen from an external device, includes: a display including a touch sensor; a communication interface; and at least one processor configured to: control the display to display a first application screen received from the external device through the communication interface and a writing pressure adjustment user interface (UI), transmit, to the external device, information on a writing pressure value set through the writing pressure adjustment UI and a touch input identified through the touch sensor, receive, from the external device through the communication interface, a second application screen including a touch trajectory identified based on the information on the writing pressure value and the touch input, and control the display to display the received second application screen.

The writing pressure adjustment UI may include a writing pressure adjustment bar configured to adjust a size of the writing pressure value, and the at least one processor may be further configured to: transmit information including the writing pressure value set by the writing pressure adjustment bar, and a touch coordinate and a touch size of the touch input identified through the touch sensor to the external device, and receive the second application screen including the touch trajectory of thickness corresponding to the writing pressure value from the external device.

The at least one processor may be further configured to control the display to display a guide UI including thickness information corresponding to the writing pressure value set through the writing pressure adjustment UI.

The electronic device may further include: a memory storing thickness information of touch trajectories according to writing pressure values corresponding to each of a plurality of applications, and the at least one processor may be further configured to control the display to display the guide UI including the thickness information of the touch trajectories corresponding to each of the plurality of applications based on the set writing pressure values.

The at least one processor may be further configured to, based on a touch input being identified in a separate area from the first application screen after the writing pressure value is set through the writing pressure adjustment UI, control the display to display a touch trajectory corresponding to the touch input based on thickness information identified based on the set writing pressure value.

The touch sensor may include an infrared touch sensor, and the at least one processor may be further configured to: identify the writing pressure value corresponding to the touch input based on a touch size of the touch input detected by the infrared touch sensor, and transmit at least one of the writing pressure value set through the writing pressure adjustment UI or the writing pressure value identified based on the touch size to the external device.

The at least one processor may be further configured to: adjust the writing pressure value set through the writing pressure adjustment UI based on the touch size, and transmit the adjusted writing pressure value to the external device.

The at least one processor may be further configured to: apply a first weight to a first writing pressure value set through the writing pressure adjustment UI, apply a second weight to a second writing pressure value identified based on the touch size, identify a third writing pressure value based on the first writing pressure value to which the first weight is applied and the second writing pressure value to which the second weight is applied, and transmit the identified third writing pressure value to the external device.

The at least one processor may be further configured to: based on the first application screen being provided to some areas of the display, provide the writing pressure adjustment UI to remaining areas of the display, and based on the first application screen being provided to entire areas of the display, provide the writing pressure adjustment UI to one area of the first application screen as a pop-up screen.

The touch input may be input by a passive input device.

According to an aspect of the disclosure, a method for controlling an electronic device for receiving and displaying an application screen from an external device, includes: displaying a first application screen received from the external device and a writing pressure adjustment user interface (UI); transmitting, to the external device, information on a writing pressure value set through the writing pressure adjustment UI and a touch input identified through a touch sensor; receiving, from the external device, a second application screen including a touch trajectory identified based on the information on the writing pressure value and the touch input; and displaying the received second application screen.

The writing pressure adjustment UI may include a writing pressure adjustment bar configured to adjust a size of the writing pressure value, the transmitting to the external device may include transmitting information including the writing pressure value set by the writing pressure adjustment bar, and a touch coordinate and a touch size of the touch input identified through the touch sensor to the external device, and the receiving the second application screen may include receiving the second application screen including the touch trajectory of thickness corresponding to the writing pressure value from the external device.

The method may further include displaying a guide UI including thickness information corresponding to the writing pressure value set through the writing pressure adjustment UI.

The displaying the guide UI may include displaying the guide UI including thickness information of touch trajectories according to writing pressure values corresponding to each of a plurality of applications.

The method may further include, based on a touch input being identified in a separate area from the first application screen after the writing pressure value is set through the writing pressure adjustment UI, displaying a touch trajectory corresponding to the touch input based on thickness information identified based on the set writing pressure value.

According to an aspect of the disclosure, electronic device for receiving and displaying an application screen, includes: a display including a touch sensor and a touch screen; at least one processor configured to: control the display to display a first application screen and a writing pressure adjustment user interface (UI), receive information on a writing pressure value set through the writing pressure adjustment UI, receive, from the touch sensor, information regarding a touch input corresponding to a contact with the touch screen, receive a second application screen including a touch trajectory identified based on the information on the writing pressure value and the information regarding the touch input, and control the display to display the received second application screen.

The writing pressure adjustment UI may include a writing pressure adjustment bar configured to adjust a size of the writing pressure value, wherein the information regarding the touch input may include a touch coordinate and a touch size of the touch input, and the touch trajectory is identified based on the touch coordinate and the touch size of the touch input.

The at least one processor may be further configured to control the display to display a guide UI including thickness information corresponding to the writing pressure value set through the writing pressure adjustment UI.

The electronic device may further include a memory storing thickness information of touch trajectories according to one or more writing pressure values corresponding to each of a plurality of applications, and the at least one processor may be further configured to control the display to display the guide UI including the thickness information of the touch trajectories corresponding to each of the plurality of applications based on the one or more set writing pressure values.

The at least one processor may be further configured to, based on a touch input identified in a separate area from the first application screen after the writing pressure value is set through the writing pressure adjustment UI, control the display to display a touch trajectory corresponding to the touch input based on thickness information identified based on the set writing pressure value.

According to an aspect of the disclosure, a non-transitory computer-readable medium stores a computer instruction which are executed by a processor of an electronic device to perform the method for controlling an electronic device for receiving and displaying an application screen from an external device.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 4 is a flow chart for illustrating a method for providing a writing pressure adjustment UI according to one or more embodiments;

DETAILED DESCRIPTION

Figure 1:
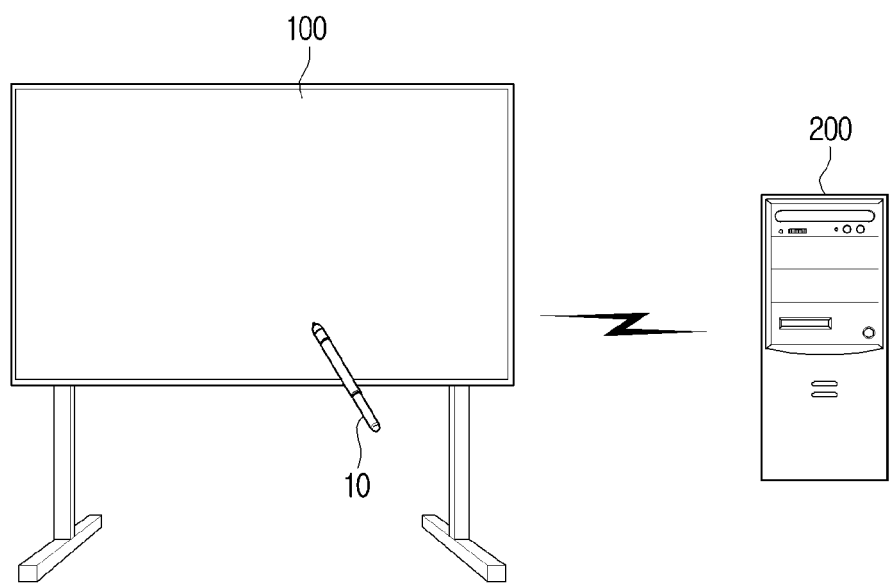
FIG. 1 is diagrams for illustrating a schematic operation of an electronic device according to one or more embodiments of the disclosure.

Hereinafter, the disclosure will be described in detail with reference to the accompanying drawings.

First, terms used in this specification will be described briefly, and then the disclosure will be described in detail.

As terms used in the disclosure, general terms that are currently used widely were selected as far as possible, in consideration of the functions described in the disclosure. However, the terms may vary depending on the intention of those skilled in the art who work in the pertinent field, previous court decisions, or emergence of new technologies, etc. Also, in particular cases, there may be terms that were designated by the applicant on his own, and in such cases, the meaning of the terms will be described in detail in the relevant descriptions in the disclosure. Accordingly, the terms used in the disclosure should be defined based on the meaning of the terms and the overall content of the disclosure, but not just based on the names of the terms.

Also, terms such as "first," "second," and the like may be used to describe various elements, but the terms are not intended to limit the elements. Such terms are used only to distinguish one element from another element.

In addition, singular expressions include plural expressions, unless defined differently in the context. Also, in the disclosure, terms such as "include" and "consist of" should be construed as designating that there are such characteristics, numbers, steps, operations, elements, components, or a combination thereof described in the specification, but not as excluding in advance the existence or possibility of adding one or more of other characteristics, numbers, steps, operations, elements, components, or a combination thereof.

Further, the expression "at least one of A or B" should be interpreted to mean any one of "A" or "B" or "A and B."

Also, in the disclosure, "a module" or "a part" performs at least one function or operation, and may be implemented as hardware or software, or as a combination of hardware and software. In addition, a plurality of "modules" or a plurality of "parts" may be integrated into at least one module and implemented as at least one processor, except "a module" or "a part" that needs to be implemented as specific hardware.

Hereinafter, the embodiments of the disclosure will be described in detail with reference to the accompanying drawings, such that those having ordinary skill in the art to which the disclosure belongs can easily carry out the disclosure. However, it should be noted that the disclosure may be implemented in various different forms, and is not limited to the embodiments described herein. Also, in the drawings, parts that are not related to explanation were omitted, for explaining the disclosure clearly, and throughout the specification, similar components were designated by similar reference numerals.

FIG. 1 is diagrams for illustrating a schematic operation of an electronic device according to one or more embodiments of the disclosure.

Referring to FIG. 1, an electronic device 100 according to one or more embodiments of the disclosure may be implemented as an electronic board including an input panel such as a touch panel and a touch screen. As understood by one of ordinary skill in the art, the electronic device 100 may be implemented as various types of electronic devices where a touch input is possible such as a mobile phone, a smartphone, an electronic photo frame, a digital information display (DID), a kiosk, a portable media player (PMP), an MP3 player, a game machine, a large format display (LFD), a notebook, a laptop, a TV, a monitor, a projector system, etc. However, the disclosure is not limited thereto, and home appliances, medical devices, etc. other than the devices discussed above may also be included in the electronic device 100.

The electronic device 100 may perform communication with an external device 200, and receive and display a content screen from the external device 200. The external device 200 may be implemented to execute various types of applications (or software or programs), and transmit an application execution screen to the electronic device 100. For example, the external device 200 may be implemented as one of various types of source devices (or host devices) such as a PC, a mobile phone, a smartphone, a portable media player (PMP), an MP3 player, a game machine, a notebook, a laptop, a TV, a projector, etc. The aforementioned applications may include various office applications such as PowerPoint, PDF, Word, Excel, etc., web browser applications, and other various utility applications known to one of ordinary skill in the art.

According to one or more embodiments, the electronic device 100 may receive a touch input by an input device such as an electronic pen or an input object such as a user hand. The electronic pen 10 may be implemented in a shape of a pen that has specific length and is thin and long so that a user can grip the pen easily. As understood by one of ordinary skill in the art, the length and thickness of the pen may vary. Accordingly, the electronic pen 10 may be referred to as various terms such as a pen-type input device, a stylus pen, an S-pen, etc. However, the electronic pen 10 does not necessarily have to be implemented in a pen shape. For example, the electronic pen 10 may be implemented to have a body in a blunt or flat shape. According to one or more embodiments, the electronic pen 10 may be implemented by a passive method. The passive method may be a method for the electronic device 100 to detect a touch input of the electronic pen 10. Examples of a passive method include a capacitive method, an electro magnetic resonance (EMR) method, etc. When the electronic pen 10 is implemented by a capacitive method, the pen may include a conductive tip having a specific area. When the electronic pen 10 is implemented by an EMR method, the pen may include a coil that induces electricity by an external magnetic field signal.

When the electronic pen 10 is operating according to
a passive method, the electronic device 100 cannot recognize more than one writing pressure value, and thus, a fixed writing pressure value is used. In this case, if writing is performed on an application screen received from the electronic device 100, a user cannot input texts or drawings in desired thickness based on an applied pressure of the pen. Even though a touch input may be supported in various thicknesses, according to a writing pressure value depending on applications, if the electronic pen 10 operating according to the passive method is used, there is a problem that such a function is not available.

Accordingly, in one or more embodiments, writing inputs in various thicknesses supported by applications may be provided even though an electronic pen is operating according to the passive method.

Figure 2A:
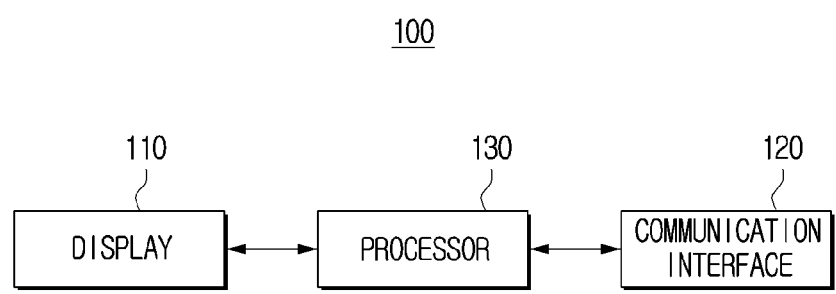
FIG. 2A is a block diagram illustrating a configuration of an electronic device, according to one or more embodiments of the disclosure.

FIG. 2A is a block diagram illustrating a configuration of an electronic device according to one or more embodiments of the disclosure.

As illustrated in FIG. 2A, the electronic device 100 may include a display 110, a communication interface 120, and at least one processor 130.

The display 110 may be implemented as a display including self-emission elements, or a display including non-self-emission elements and a backlight. For example, the display 110 may be implemented as various forms of displays such as a liquid crystal display (LCD), an organic light emitting diodes (OLED) display, light emitting diodes (LED), a micro LED, a mini LED, a plasma display panel (PDP), a quantum dot (QD) display, quantum dot light emitting diodes (QLED), or any other display configuration known to one of ordinary skill in the art. Inside the display 110, driving circuits may be implemented in one or more circuit configurations such as an a-si TFT, a low temperature poly silicon (LTPS) TFT, an organic TFT (OTFT), etc. A backlight unit may also be included. The display 110 may be implemented as a flexible display, a rollable display, a 3D display, a display where a plurality of display modules are physically connected, etc.

According to one or more embodiments, the display 110 may include a touch module (or touch sensor). According to one or more embodiments, the touch module may include sensors such as a touch sensor, a proximity sensor, etc., or a sensor and an operation device. For example, the operation device may be implemented as a micro controller unit (MCU), a micro processing unit (MPU), etc. The operation device may decipher instructions included in a register, an operation circuit, and a control circuit, and perform operating and controlling operations. The functions of the operating device are not limited thereto. According to one or more embodiments, the touch module may acquire information on a touch input detected through the touch sensor, and transmit the information to the processor 130. The information on the touch input may include a touch coordinate, a touch size, a writing pressure value, tilt information, etc. When the electronic pen 10 is operating according to the passive method, the pen does not detect a writing pressure value, and thus, the touch module transmits a predetermined writing pressure value to the processor 130.

According to one or more embodiments, the touch sensor may be implemented in at least one of a capacitive method, a decompressive method, an infrared method, or an ultrasonic method. The capacitive method may include implementing a sensor by using a dielectric body coated on the surface of the display, detecting micro electricity excited to a user's body when a part of the user's body touched the surface of the display, and calculating a touch coordinate. The decompressive method may include implementing a touch sensor by including two built-in electrode plates, detecting a flow of a current as the upper and lower plates on a touched point contact, and calculating a touch coordinate. As understood by one of ordinary skill in the art, light has the tendency of going straight when unblock, and not being able to go straight when blocked. The infrared method may include implementing a touch sensor by using the attribute of light of having the tendency of going straight when unblocked, and having the tendency of not being capable of going straight when blocked by an obstacle. A surface ultrasonic conductive method, an integration type tension measurement method, a piezo effect method, or any other method known to one of ordinary skill in the art for detecting a touch manipulation may be used.

The touch sensor may use a magnetic and a magnetic field sensor, an optical sensor, or a proximity sensor, etc. to determine whether a touch object such as a finger or a stylus pen contacted or got close to the touch screen FIG. 3A to FIG. 3D are diagrams for illustrating a method for detecting a touch according to one or more embodiments.

Figure 3A:
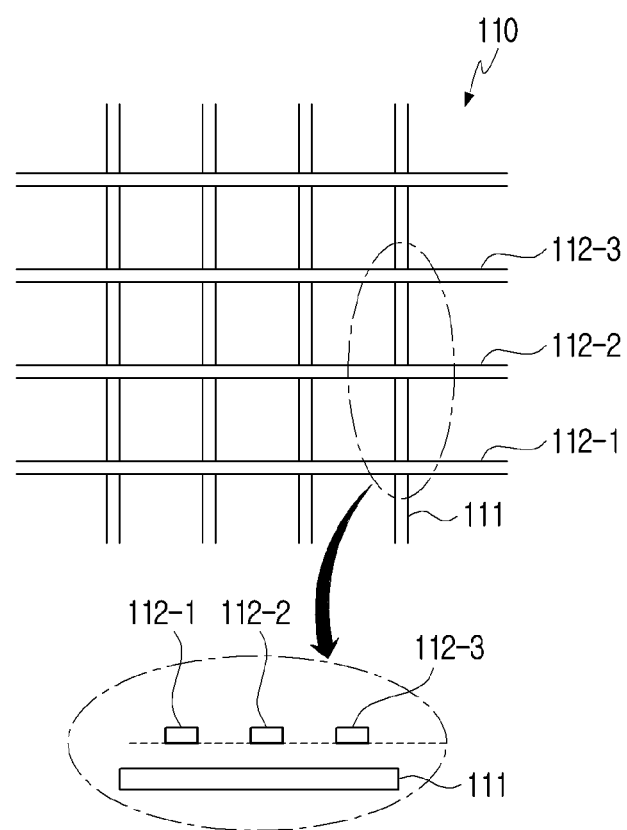
FIG. 3A to FIG. 3D are diagrams for illustrating a method for detecting a touch, according to one or more embodiments.

According to one or more embodiments, a capacitive touch sensor may have an electrode pattern structure as in FIG. 3A. The electrode pattern, in a grid shape as illustrated in FIG. 3A, may include a vertical line 111 and horizontal lines 112-1, 112-2, 112-3. The touch sensor may be divided into a transmitter that transmits an electric field, and a receiver that detects a change in the electric field. The touch sensor may detect a coordinate by detecting a change in the electric field by contact of a conductive body. For example, if the electronic pen 10 outputs an electric field, the electrode pattern may detect a change in the electric field. A method of dividing an electrode in a first direction as a transmitter and an electrode in a second direction as a receiver among electrodes in two intersecting directions, may be used to detect contact by a finger.

Figure 3B:
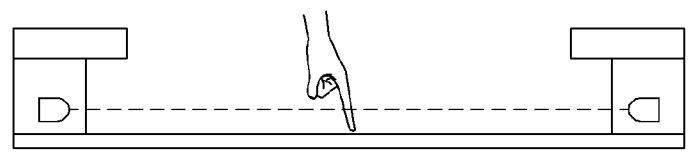
Figure 3C:
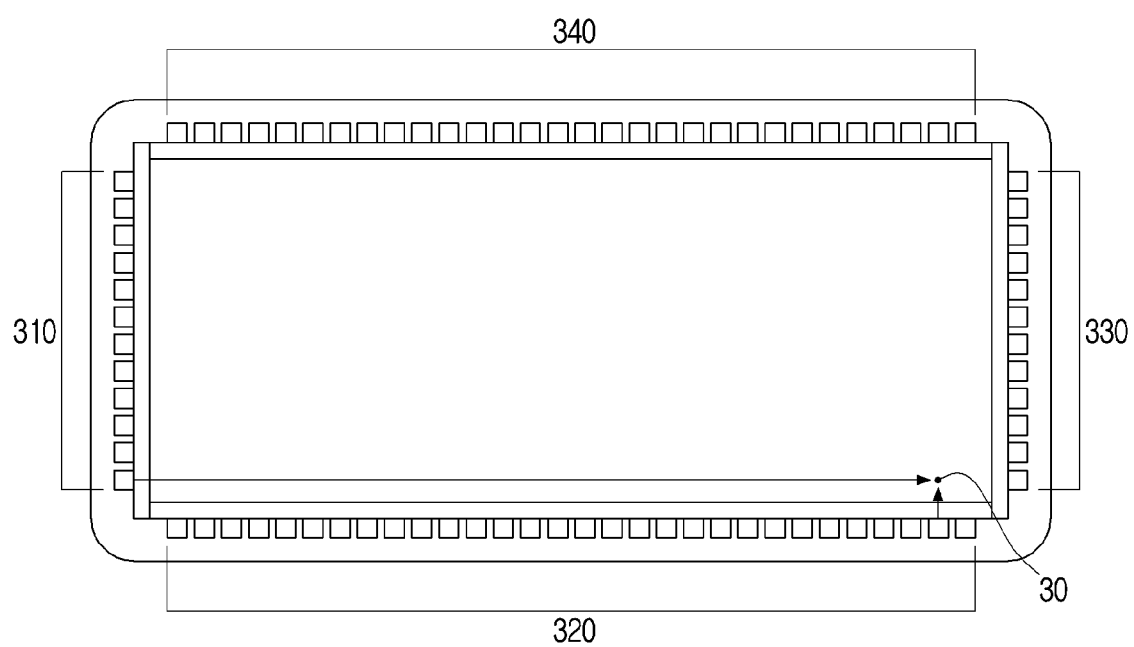

According to one or more embodiments, an infrared touch sensor may utilize an opto-matrix frame by arranging an infrared light emitting diode (LED), which is a light emitting element, and a photo-transistor (or a photo-diode), which is a light receiving element, to face each other, and install the frame on the display 110. As illustrated in FIG. 3B, if a screen is selected with an object that can block light such as a finger on the display 110 on which the opto-matrix frame is mounted, light emitted from the infrared light emitting diode is blocked by the finger and is not detected at the photo-transistor on the opposite side. Therefore when the light is blocked, it may be determined in which cell the light was blocked. For example, as illustrated in FIG. 3C, the infrared light emitting diodes 310, 320 may be arranged on the left side and the lower side of the display 110, and the photo-transistors 330, 340 may be arranged on the right side and the upper side of the display 110.

Figure 3D:
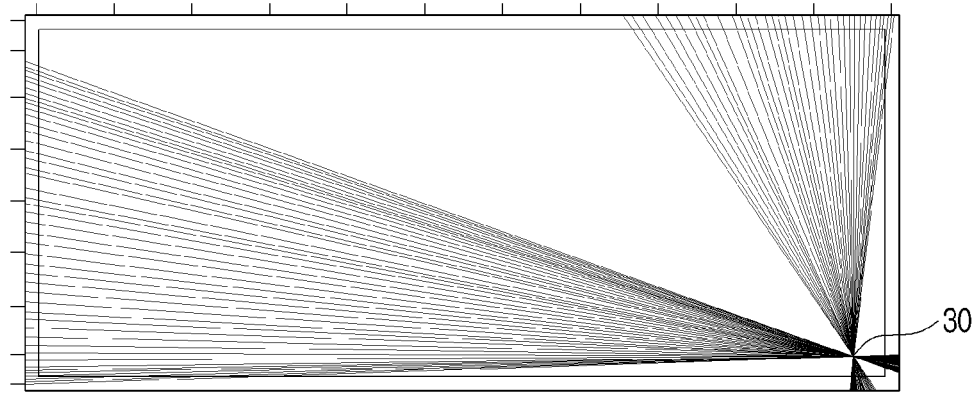

For example, if a specific point 30 on the screen is touched by the electronic pen 10, an area covered by infrared light is generated as illustrated in FIG. 3D, thereby enabling identification of the touch point. Furthermore, according to the size and the location of a touch object touched on the specific point 30 (e.g., the electronic pen 10), the size and the location of the area covered by the infrared light (e.g., shadow of the object) may vary, and thus, the touch size can also be identified. For example, in the case of a small object, an area covering a light is small, and thus, only a small number photo-transistors do not receive light. In the case of a big object, a large number of photo-transistors do not receive light. Accordingly, the area of the object may be easily acquired by using the location/distance of the object and the size of the shadow.

The communication interface 120 may be a component that performs communication with an external device (e.g., FIG. 1, 200). For example, the communication interface 120 may receive input of an image signal by a streaming or download method from an external device (e.g., a source device), an external storage medium (e.g., a USB memory), an external server (e.g., a webhard), etc. The input may be received through communication methods such as Wi-Fi based on AP (a wireless LAN network), Bluetooth, Zigbee, a wired/wireless local area network (LAN), a wide area network (WAN), Ethernet, IEEE 1394, a high-definition multimedia interface (HDMI), a universal serial bus (USB), a mobile high-definition link (MHL), Audio Engineering Society/European Broadcasting Union (AES/EBU), Optical, Coaxial, etc. The image signal may be a digital image signal of any one of a standard definition (SD), a high definition (HD), a Full HD, or an ultra HD image. As understood by one of ordinary skill in the art, the image signal is not limited to these resolutions, and may use any suitable resolution known to one of ordinary skill in the art.

According to one or more embodiments, the communication interface 120 may include a first communication interface and a second communication interface. The first communication interface may perform communication with the external device 200, and transmit/receive image data/audio data, etc. For example, the first communication interface may be implemented as an interface that may transmit/receive image data/audio data such as a high-definition multimedia interface (HDMI), a display port (DP), etc., but is not limited thereto. The second communication interface may transmit a touch signal acquired through the touch module to the external device 200. The touch signal may include at least one of a touch coordinate, a touch size, a writing pressure value, and a tilt value of the electronic pen 10. For example, the second communication interface may be implemented as an interface such as a universal serial bus (USB), etc., but is not limited thereto.

The at least one processor 130 (e.g., referred to as the processor hereinafter) may control the overall operations of the electronic device 100. For example, the processor 130 may be connected with each component of the electronic device 100, and control the overall operations of the electronic device 100. For example, the processor 130 may be electronically connected with the display 110 and a memory (FIG. 2B, 140), and control the overall operations of the electronic device 100. The processor 130 may include one or a plurality of processors.

The processor 130 may perform operations of the electronic device 100 according to the various embodiments by executing at least one instruction stored in the memory 140.

According to one or more embodiments, the processor 130 may be implemented as a digital signal processor (DSP) processing digital image signals, a microprocessor, a graphics processing unit (GPU), an artificial intelligence (AI) processor, a neural processing unit (NPU), and a time controller (TCON). However, the disclosure is not limited thereto, and the processor 130 may include one or more of a central processing unit (CPU), a micro controller unit (MCU), a micro processing unit (MPU), a controller, an application processor (AP), or a communication processor (CP), an ARM processor, or any other processor known to one of ordinary skill in the art. Furthermore, the processor 130 may be implemented as a system on chip (SoC) having a processing algorithm stored therein or large scale integration (LSI), or in the configuration of an application specific integrated circuit (ASIC) and a field programmable gate array (FPGA).

Figure 2B:
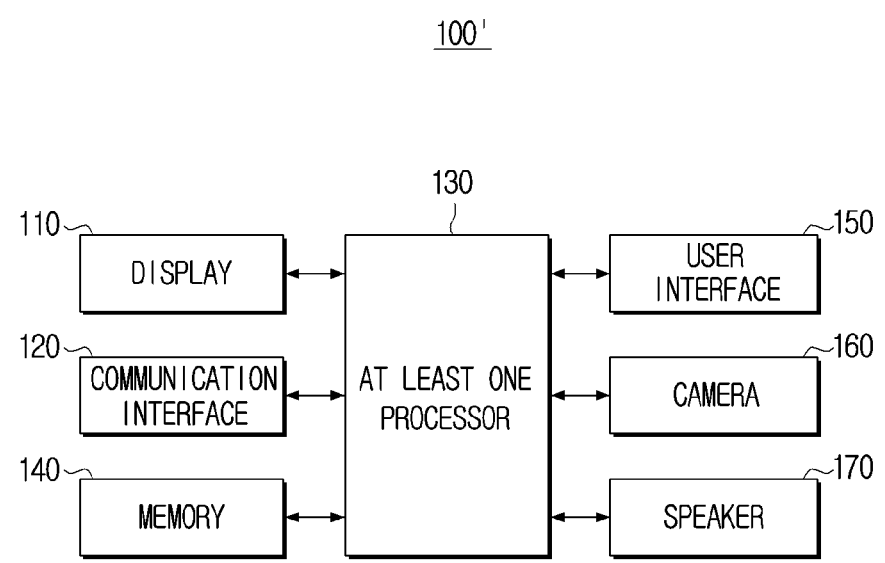
FIG. 2B is a diagram illustrating a detailed configuration of an implementation example of an electronic device, according to one or more embodiments of the disclosure.

FIG. 2B is a diagram illustrating a detailed configuration of an example of an electronic device, according to one or more embodiments of the disclosure.

According to FIG. 2B, the electronic device 100' includes a display 110, a communication interface 120, a processor 130, a memory 140, a user interface 150, a camera 160, and a speaker 170. Some components illustrated in FIG. 2B may overlap with the components illustrated in FIG. 2A.

The memory 140 may be electronically connected with the processor 130, and store data necessary for the various embodiments of the disclosure. The memory 140 may be implemented in a form of a memory embedded in the electronic device 100', or in a form of a memory that may be attached to or detached from the electronic device 100' according to the usage of stored data. For example, in the case of data for operating the electronic device 100', the data may be stored in a memory embedded in the electronic device 100', and in the case of data for an extended function of the electronic device 100', the data may be stored in a memory that can be attached to or detached from the electronic device 100'. In the case of a memory embedded in the electronic device 100', the memory may be implemented as at least one of a volatile memory such as, a dynamic RAM (DRAM), a static RAM (SRAM), or a synchronous dynamic RAM (SDRAM), etc. The memory may be a non-volatile memory such as, a one time programmable ROM (OTPROM), a programmable ROM (PROM), an erasable and programmable ROM (EPROM), an electrically erasable and programmable ROM (EEPROM), a mask ROM, a flash ROM, a flash memory (e.g., NAND flash or NOR flash, etc.), a hard drive, or a solid state drive (SSD). Furthermore, in the case of a memory that may be attached to or detached from the electronic device 100', the memory may be implemented in forms such as a memory card (e.g., compact flash (CF), secure digital (SD), micro secure digital (Micro-SD), mini secure digital (Mini-SD), extreme digital (xD), a multimedia card (MMC), etc.), an external memory that may be connected to a USB port (e.g., a USB memory), etc.

According to one or more embodiments, the memory 140 may store a computer program including at least one instruction or instructions for controlling the electronic device 100'.

According to one or more embodiments, the memory 140 may store an image received from an external device (e.g., a source device), an external storage medium (e.g., a USB), an external server (e.g., a webhard), etc. The memory may store an input image, various types of data, information, etc.

According to one or more embodiments, the memory 140 may store information related to the various embodiments to be described below such as thickness information corresponding to writing pressure values for each of a plurality of applications, information on writing pressure values for each touch size, information on weights for each touch size, thickness information corresponding to writing pressure values for each pen-tip, etc. For example, such information may be stored in the form of a look-up table, or stored in forms of a formula and an algorithm.

According to one or more embodiments, the memory 140 may be implemented as a single memory storing data generated from the various operations according to the disclosure. However, according to one or more embodiments, the memory 140 may also be implemented to include a plurality of memories that respectively store different types of data, or respectively store data generated in different steps.

In the aforementioned embodiment, it was described that various types of data may be stored in the external memory 140 of the processor 130. However, at least some of the aforementioned data may be stored in an internal memory of the processor 130 according to at least one implementation example of the electronic device 100' or the processor 130.

The user interface 150 may be implemented as a device such as a button, a touch pad, a mouse, and a keyboard, or implemented as a touch screen that may perform the aforementioned display function and a manipulation input function together. According to one or more embodiments, the user interface 150 may be implemented as a remote control transceiver, and receive a remote control signal. The remote control transceiver may receive a remote control signal or transmit a remote control signal from an external remote control device through at least one communication method among infrared communication, Bluetooth communication, and Wi-Fi communication.

In one or more embodiments, the camera 160 may be turned on according to a predetermined event, and perform photographing. The camera 160 may convert a photographed image into an electronic signal, and generate image data based on the converted signal. For example, an object may be converted into an electronic image signal through a semiconductor optical element (a charge coupled device (CCD)), and the image signal converted as such may be amplified and converted into a digital signal, and go through signal processing. However, the camera 160 may not be included, depending on implementation examples of the electronic device 100'.

The speaker 170 may output audio signals. For example, the speaker 170 may convert a digital audio signal processed at the processor 130 into an analog audio signal, and amplify and output the signal. For example, the speaker 170 may include at least one speaker unit, a D/A converter, an audio amplifier, etc. that can output at least one channel. According to one or more embodiments, the speaker 170 may be implemented to output various multi-channel audio signals. In this case, the processor 130 may control the speaker 170 to perform enhanced processing of an input audio signal to correspond to enhanced processing of an input image and output the signal.

The electronic device 100' may further include a tuner and a demodulator depending on implementation examples. The tuner may tune a channel selected by a user in a radio frequency (RF) broadcast signal received through an antenna, or all pre-stored channels, and receive an RF broadcast signal. The demodulator may receive a converted digital IF (DIF) signal from the tuner and demodulate the signal, and perform channel demodulation, etc.

FIG. 4 is a flow chart for illustrating a method for providing a writing pressure adjustment UI, according to one or more embodiments.

According to one or more embodiments illustrated in FIG. 4, the processor 130 may control the display 110 to display an application screen received from the external device 200 and a writing pressure adjustment UI in operation S410.

According to one or more embodiments, if the application screen is provided to some areas of the display 110, the processor 130 may provide the writing pressure adjustment UI to the remaining areas of the display 110 that do not include the application screen.

According to one or more embodiments, if the application screen is provided to the entire area of the display 110 as the entire screen, the processor 130 may provide the writing pressure adjustment UI to one area of the application screen as a pop-up screen.

In one or more examples, if the application screen is provided to some areas of the display 110, the processor 130 may provide the writing pressure adjustment UI to one area of the application screen as a pop-up screen.

The processor 130 may transmit information on a writing pressure value, set through the writing pressure adjustment UI and a touch input identified through the touch module, to the external device 200 in operation S420.

According to one or more embodiments, the writing pressure adjustment UI may include a writing pressure adjustment bar that may adjust the size of a writing pressure value. In one or more examples, the writing pressure adjustment bar may be implemented in a form that in which one of continuous writing pressure values according to a user instruction is selected. A user instruction may be input as a touch input or a remote control signal. For example, as the location of an indicator included in the writing pressure adjustment bar is adjusted, a writing pressure value may be set. In one or more examples, the location of the indicator may be adjusted through a touch input, or adjusted through a remote control signal.

However, the disclosure is not limited thereto, and it is also possible that the writing pressure adjustment UI is implemented in a form in which one of a plurality of predefined writing pressure values (or writing pressure levels) is selected. Information on a touch input (e.g., referred to as touch input information hereinafter) may include a touch coordinate and a touch size of the touch input. According to one or more embodiments, the touch input information may be received from the touch module. In this case, the processor 130 may transmit the information including the writing pressure value set by the writing pressure adjustment bar, and the touch coordinate and the touch size provided from the touch module to the external device 200.

According to one or more embodiments, the touch input information received from the touch module may include at least one of a touch coordinate, a touch size, a writing pressure value, or a tilt value of a touch input. When the electronic pen 10 is a passive device, the writing pressure value may be a fixed value because the touch module does not detect a writing pressure value. In this case, the processor 130 may replace the fixed writing pressure value received from the touch module by the writing pressure value set through the writing pressure adjustment UI, and transmit the value to the external device 200. These features may be possible because, according to one or more embodiments, the touch input information may be acquired by the processor such as an MCU provided in the touch module and transmitted in the form of a packet including other touch input information such as a touch coordinate, a tilt, etc. Therefore, a writing pressure value may be acquired by the processor 130 provided in an SOC separate from the touch module.

In operation S420, the information on a writing pressure value set through the writing pressure adjustment UI and a touch input identified through the touch module may be transmitted to the external device. After the writing pressure value is acquired, the processor 130 may receive an application screen including a touch trajectory identified based on the writing pressure value and other touch input information from the external device 200 in operation S430, and display the received application screen in operation S440. According to one or more embodiments, the application screen received from the external device 200 may be an application screen including a touch trajectory of thickness corresponding to the writing pressure value. For example, as the processor 130 transmitted the writing pressure value set through the writing adjustment UI as the information on the touch input in operation S420, the processor 130 may receive the application screen including a touch trajectory corresponding to the writing pressure value in operation S430. Accordingly, even if the electronic pen 10 is operating according to the passive method, a touch input of thickness desired by a user may be performed.

Figure 5A:
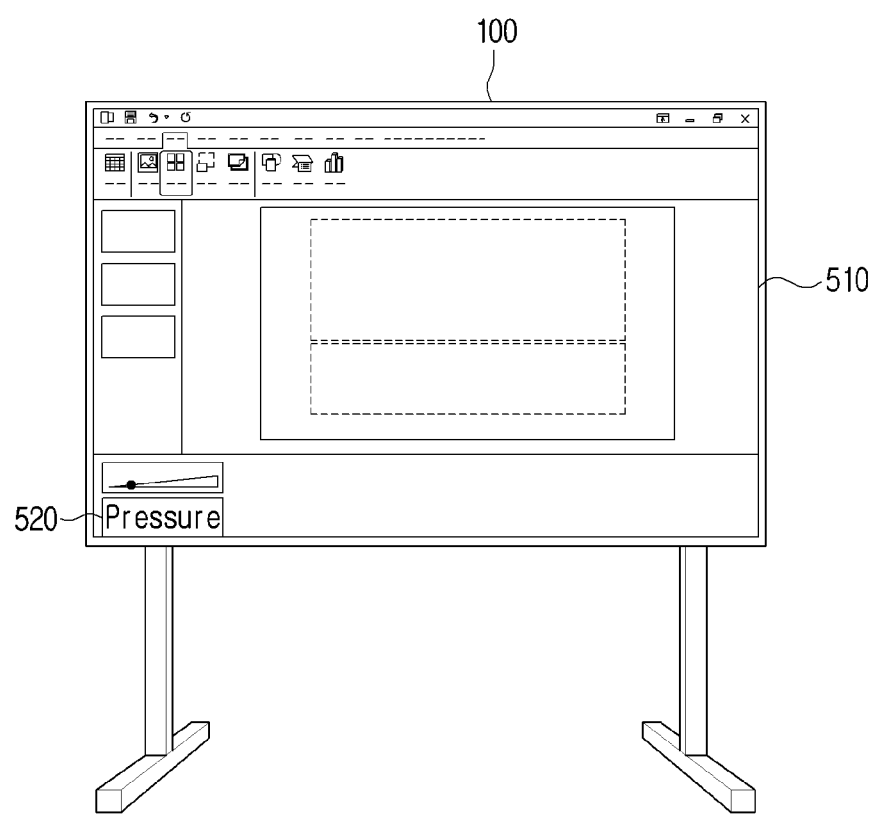
FIG. 5A and FIG. 5B are diagrams for illustrating a method for providing a writing pressure adjustment UI according to one or more embodiments.
Figure 5B:
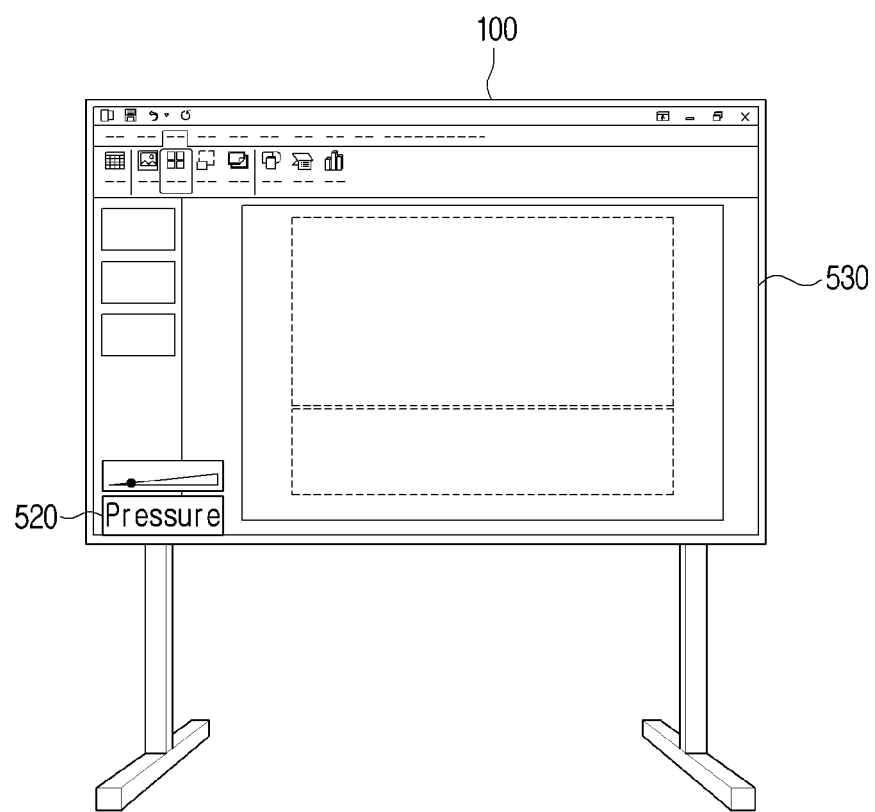

FIG. 5A and FIG. 5B are diagrams for illustrating a method for providing a writing pressure adjustment UI, according to one or more embodiments.

According to one or more embodiments, when an application screen 510 received from the external device 200 is provided to some areas of the display 110 (e.g., the application screen 210 is not displayed on an entire portion of display 110), as illustrated in FIG. 5A, the processor 130 may provide the writing pressure adjustment UI 520 to the remaining areas of the display 110. However, the processor 130 may also provide the writing pressure adjustment UI 520 to one area of the application screen 510 as a pop-up screen. For example, the provisioning of the application screen 510 and/or the writing pressure adjustment UI 520 may be set and/or changed by a user.

According to one or more embodiments, if an application screen 530 received from the external device 200 is provided to the entire areas of the display 110 as the entire screen, as illustrated in FIG. 5B, the processor 130 may provide the writing pressure adjustment UI 520 to one area of the application screen 530 as a pop-up screen.

Figure 6A:
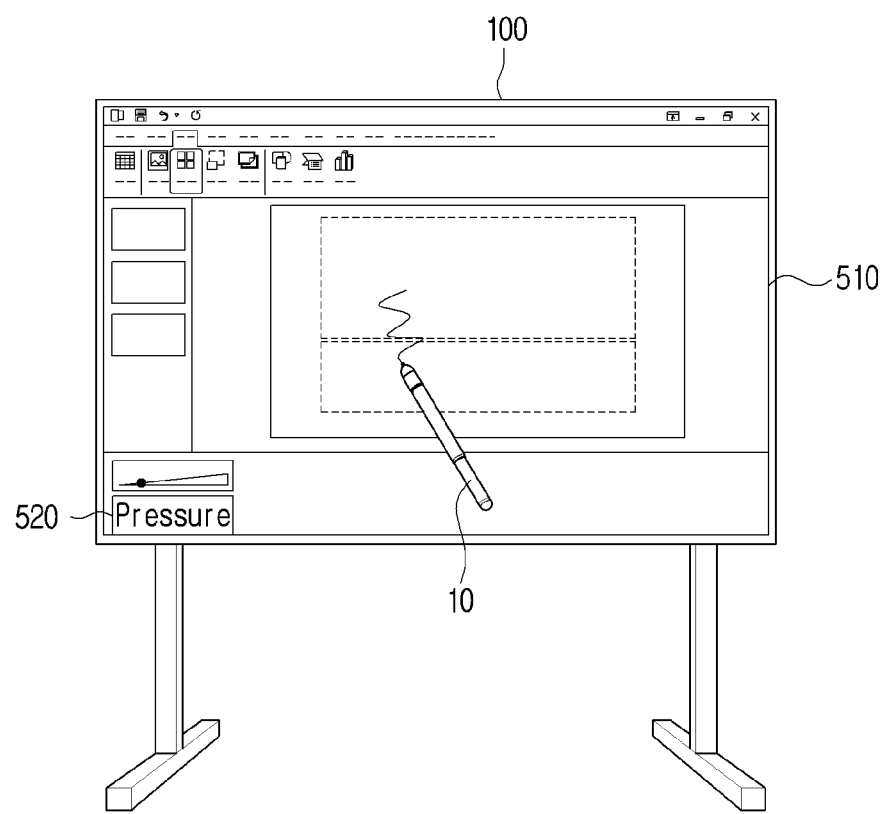
FIG. 6A and FIG. 6B are diagrams for illustrating thickness of a touch trajectory provided from an application screen according to a writing pressure value, according to one or more embodiments.
Figure 6B:
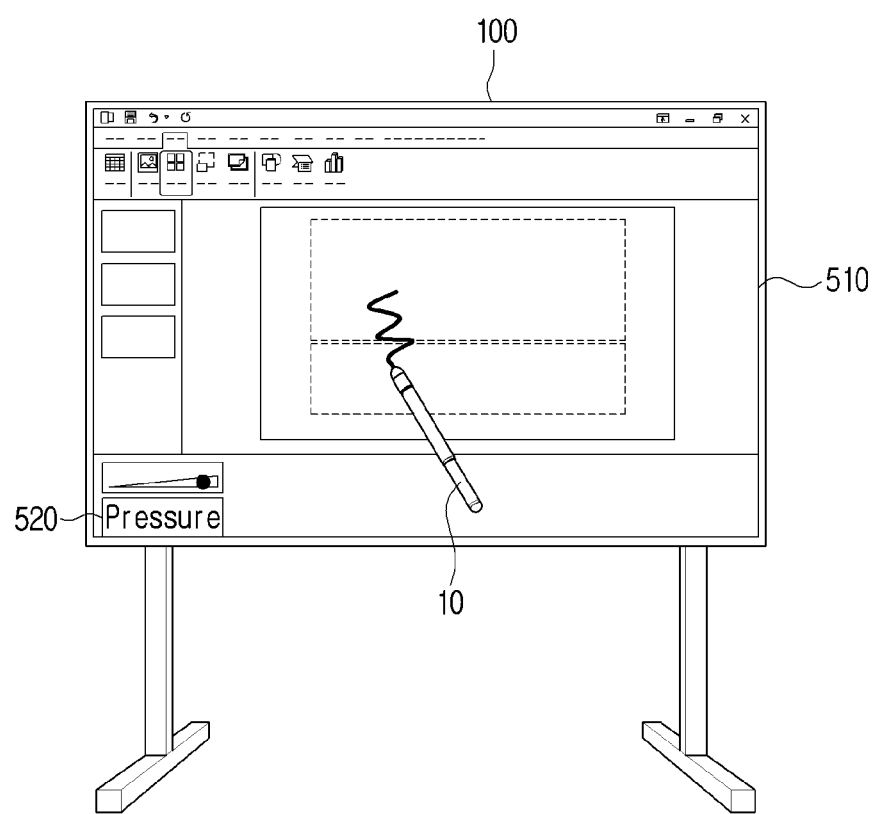

FIG. 6A and FIG. 6B are diagrams for illustrating thickness of a touch trajectory provided from an application screen according to a writing pressure value, according to one or more embodiments.

According to one or more embodiments, as illustrated in FIG. 6A, if a writing pressure value is adjusted to a first value (e.g., the smallest value through the writing pressure adjustment UI 520 while the application screen 510 is provided), and a touch input through the electronic pen 10 is received, the thickness of the touch trajectory may be displayed to be thin. The thickness of the touch trajectory may be thin because the writing pressure value set through the writing pressure adjustment UI 520 (e.g., the first value) was transmitted to the external device 200 together with other information on the touch input (e.g., the touch coordinate), and an application screen reflecting the touch trajectory of the thickness corresponding to the first value was received from the external device 200.

According to one or more embodiments, as illustrated in FIG. 6B, if a writing pressure value is adjusted to a second value (e.g., the biggest/largest value) through the writing pressure adjustment UI 520 while the application screen 510 is provided, and a touch input through the electronic pen 10 is received, the thickness of the touch trajectory may be displayed to be relatively thick. is the relatively thick trajectory occurs because the writing pressure value set through the writing pressure adjustment UI 520 (e.g., the second value) was transmitted to the external device 200 together with other information on the touch input (e.g., the touch coordinate), and an application screen reflecting the touch trajectory of the thickness corresponding to the second value was received from the external device 200.

Figure 7:
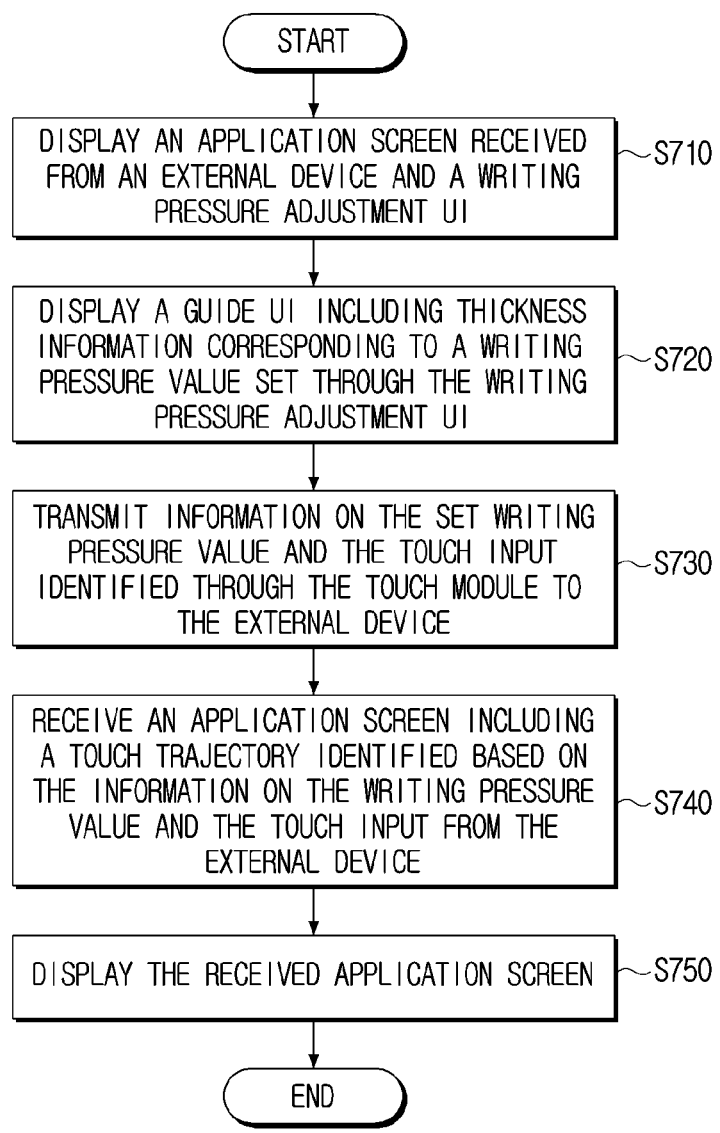
FIG. 7 is a flow chart for illustrating a method for providing a writing pressure adjustment UI, according to one or more embodiments.

FIG. 7 is a flow chart for illustrating a method for providing a writing pressure adjustment UI according to one or more embodiments.

According to one or more embodiments, the processor 130 may provide not only a writing pressure adjustment UI, but also a guide UI including thickness information corresponding to the writing pressure value set through the writing pressure adjustment UI.

According to one or more embodiments, as illustrated in FIG. 7, the processor 130 may control the display 110 to display an application screen received from the external device 200 through the communication interface 120 and the writing pressure adjustment UI in operation S710.

Furthermore, the processor 130 may display a guide UI including thickness information corresponding to the writing pressure value set through the writing pressure adjustment UI in operation S720. Further explanation in this regard will be described with reference to FIG. 8A to FIG. 8D.

The processor 130 may transmit information on a touch input identified through the writing pressure value set through the writing pressure adjustment UI and a touch input identified through the touch module to the external device 200 in operation S730.

After transmitting information on the touch input, the processor 130 may receive an application screen including a touch trajectory identified based on information on the writing pressure value and the touch input from the external device 200 in operation S740, and display the received application screen in operation S750.

FIG. 8A to FIG. 8D are diagrams for illustrating a method for providing a guide UI according to one or more embodiments.

According to one or more embodiments, the processor 130 may provide a guide UI so that a user can recognize thickness corresponding to the writing pressure value set through the writing pressure adjustment UI.

Figure 8A:
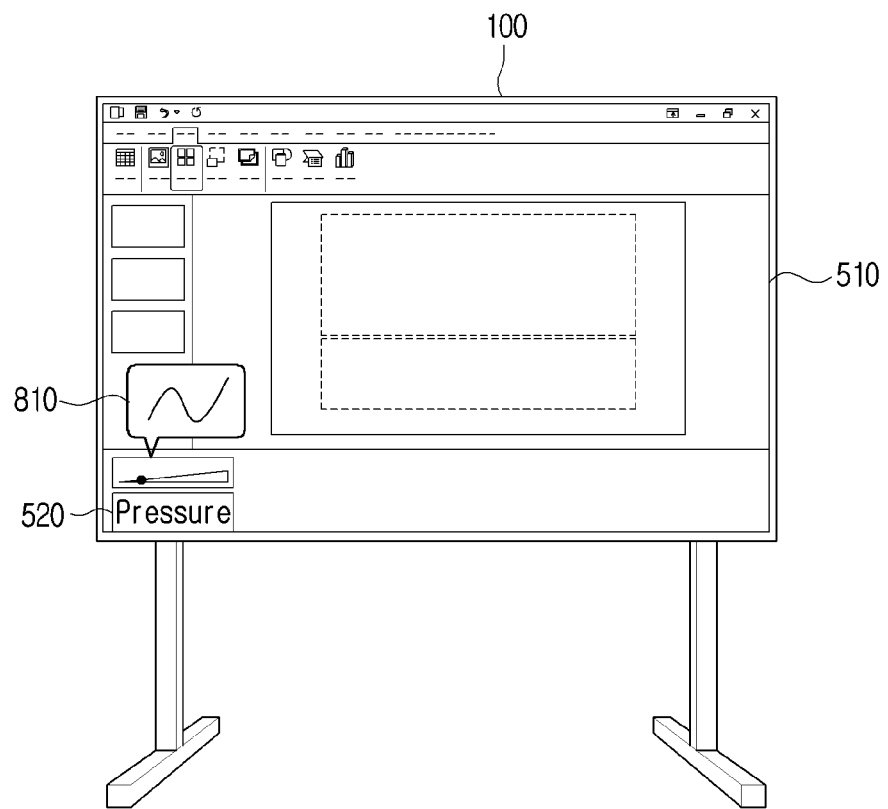
FIG. 8A to FIG. 8D are diagrams for illustrating a method for providing a guide UI, according to one or more embodiments.

According to one or more embodiments, as illustrated in FIG. 8A, when a writing pressure value is set through the writing pressure adjustment UI 520, a guide UI 810 including thickness corresponding to the set writing pressure value may be provided. In this case, the processor 130 does not identify an application corresponding to the application screen 510, and thus, the processor 130 does not identify the correct thickness that is actually provided from the application. Accordingly, the processor 130 may provide predetermined thickness corresponding to the writing pressure value to the guide UI 810. In this embodiment, it is illustrated that the guide UI 810 is provided to the application screen 510 as a pop-up screen, but the disclosure is not necessarily limited to this configuration. For example, it is also possible that the guide UI 810 is provided to the remaining areas which are not the areas where the application screen 510 is provided (e.g., the right side area of the area where the writing pressure adjustment UI 520 is provided).

Figure 8B:
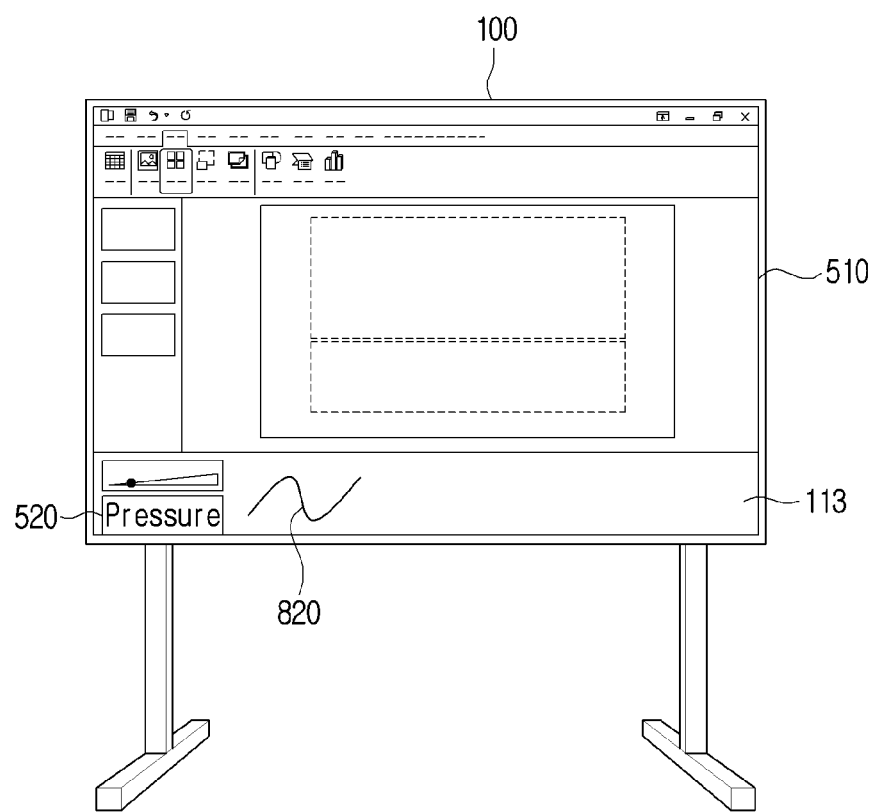

According to one or more embodiments, as illustrated in FIG. 8B, if a writing pressure value is set through the writing pressure adjustment UI 520, and a touch input is subsequently identified on an area 113 separate from the application screen 510, the processor 130 may display a touch trajectory 820 corresponding to the touch input based on thickness information identified based on the set writing pressure value. Accordingly, the user can be guided with approximate thickness information regarding the set writing pressure value.

Figure 8C:
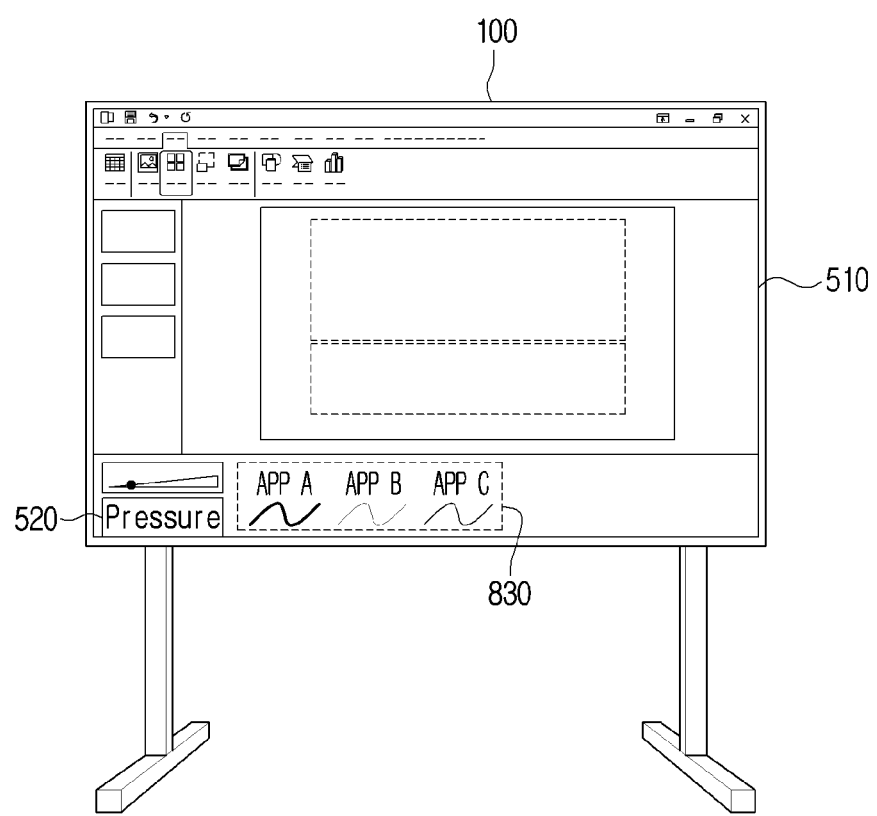

According to one or more embodiments, as illustrated in FIG. 8C, if a writing pressure value is set through the writing pressure adjustment UI 520, a guide UI 830 including thickness information corresponding to writing pressure values set for each of a plurality of applications may be provided. The thickness information corresponding to the writing pressure values for each of the plurality of applications may have been received from the external device 200, or may have been received from an external server and stored in advance in the memory 140.

The processor 130 may display the guide UI 830 including thickness information of touch trajectories corresponding to each of the plurality of applications based on the set writing pressure value and the information stored in the memory 140. Since the processor 130 does not identify an application corresponding to the application screen 510, the processor does not identify the correct thickness that is actually provided from the application.

For example, as illustrated in FIG. 8C, the guide UI 830 including thickness information corresponding to writing pressure values set for each of an application A (APP A), an application B (APP B), and an application C (APP C) may be provided. Accordingly, the user may identify the thickness of the writing corresponding to the currently provided application screen 510.

Figure 8D:
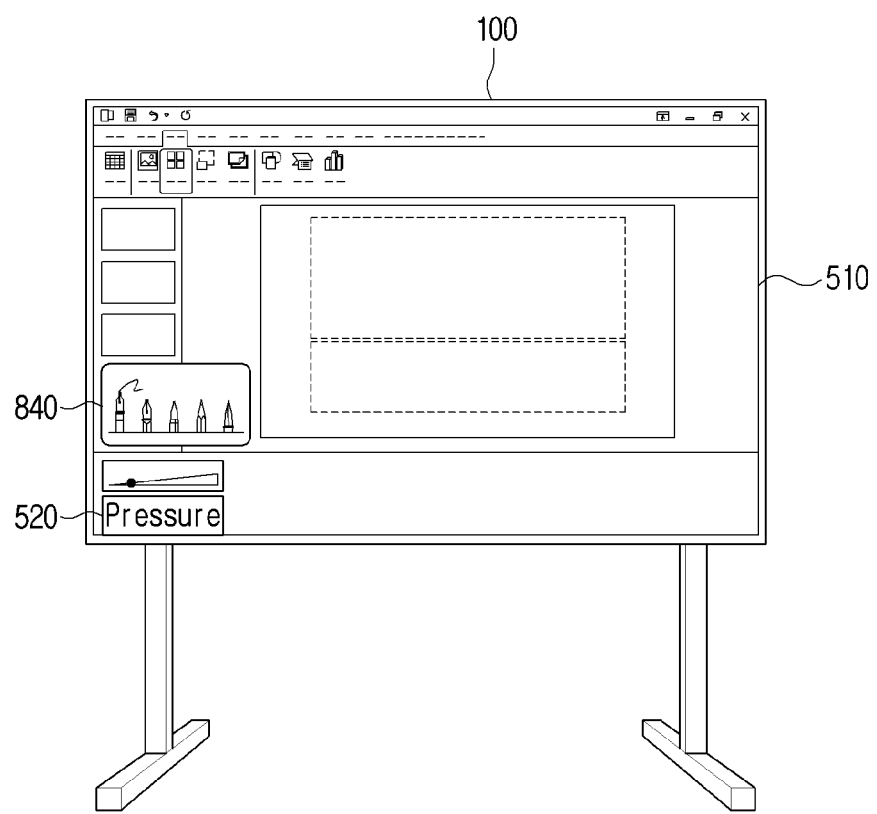

According to one or more embodiments, as illustrated in FIG. 8D, when a writing pressure value is set through the writing pressure adjustment UI 520, a guide UI 840 including thickness corresponding to writing pressure values set for each pen-tip may be provided. The thickness information corresponding to the writing pressure values for each of the plurality of pen-tips may have been stored in advance in the memory 140 as a predetermined value. The pen-tips may include various pen-tip types such as a triangular shape, a circular shape, a blade shape, a scoop shape, or any other suitable shape known to one of ordinary skill in the art.

Figure 9:
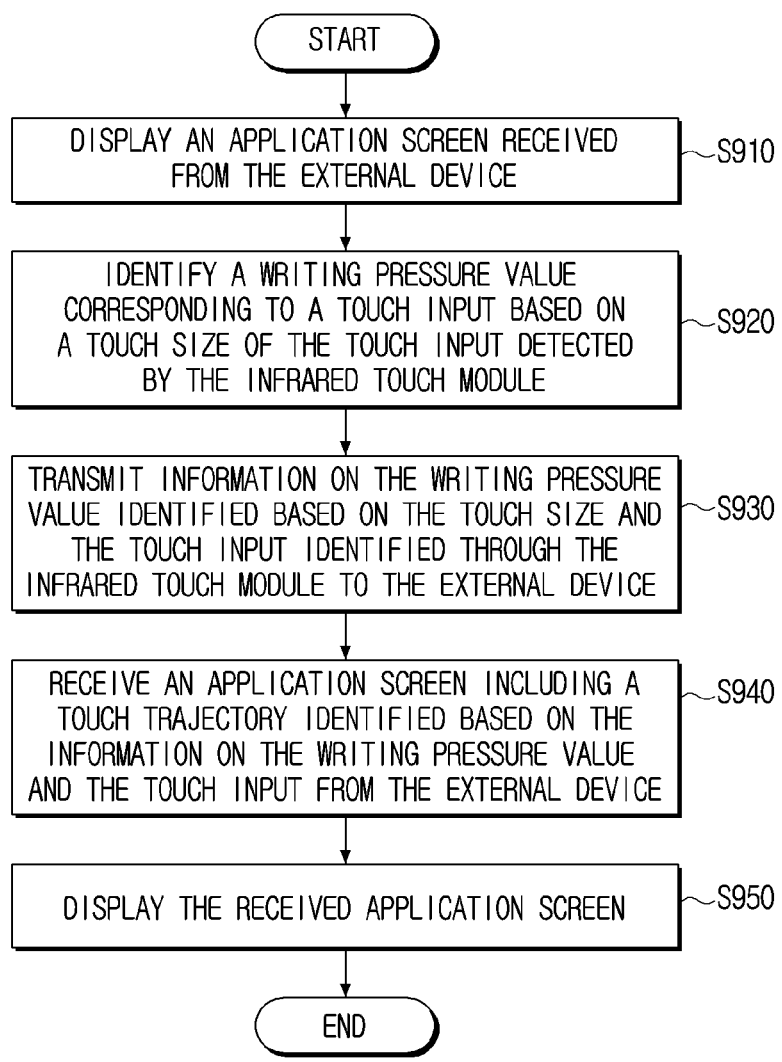
FIG. 9 is a flow chart for illustrating a method for identifying a writing pressure value, according to one or more embodiments.

FIG. 9 is a flow chart for illustrating a method for identifying a writing pressure value according to one or more embodiments.

According to one or more embodiments, as illustrated in FIG. 9, the processor 130 may display an application screen received from the external device 200 in operation S910.

After the application screen is displayed, a writing pressure value corresponding to a touch input may be identified based on the touch size of the touch input detected by the infrared touch module in operation S920. For example, as illustrated in FIG. 3D, the size of the touch input may be identified based on the location and/or the size of the area covered by the infrared light. As an example, information on writing pressure values corresponding to touch sizes may have been stored in advance in the memory 140 in the form of a look-up table.

The processor 130 may transmit the information on the writing pressure value identified based on the touch size and the touch input identified through the infrared touch module to the external device 200 in operation S930. The information on the touch input may include at least one of the touch coordinate, the touch size, or the tilt information. According to one or more embodiments, the processor 130 may replace the writing pressure value included in the information on the touch input received from the infrared touch module by a writing pressure value identified based on the touch size, and transmit the value to the external device 200. These features are provided because, in the case of the electronic pen 10 operating according to the passive method, a writing pressure value is not detected at the infrared touch module, and thus, the writing pressure value included in the information on the touch input received from the infrared touch module may be a fixed value.

After operation S930, the processor 130 may receive an application screen including a touch trajectory identified based on the information on the writing pressure value and the touch input from the external device 200 in operation S940, and display the received screen in operation S950.

According to one or more embodiments, in case a first writing pressure value is identified through the writing pressure adjustment UI, and a second writing pressure value is identified based on a touch size, the processor 130 may select any one of the first writing pressure value or the second writing pressure value, and transmit the value to the external device 200. For example, the processor 130 may select any one of the first writing pressure value or the second writing pressure value according to a predetermined priority. In one or more examples, the processor 130 may select the bigger value (or the smaller value) between the first writing pressure value and the second writing pressure value. In one or more examples, the processor 130 may transmit an average value of the first writing pressure value and the second writing pressure value to the external device 200.

According to one or more embodiments, the processor 130 may adjust the writing pressure value set through the writing pressure adjustment UI based on a touch size, and transmit the adjusted writing pressure value to the external device 200. For example, the processor 130 may apply a weight identified based on a touch size to the writing pressure value set through the writing pressure adjustment UI, and thereby adjust the writing pressure value. As an example, weights for each touch size may have been stored in advance in the memory 140 in the form of a look-up table.

According to one or more embodiments, the processor 130 may apply a first weight to the first writing pressure value set through the writing pressure adjustment UI, and apply a second weight to the second writing pressure value identified based on a touch size. The processor 130 may identify a third writing pressure value based on the first writing pressure value to which the first weight is applied and the second writing pressure value to which the second weight is applied, and transmit the value to the external device 200. For example, the first weight and the second weight may have been predetermined, or may vary based on the sizes, the difference, etc. of the first writing pressure value and the second writing pressure value. As an example, the processor 130 may identify the average value of the first writing pressure value to which the first weight is applied and the second writing pressure value to which the second weight is applied as the third writing pressure value. As an example, the processor 130 may identify the bigger value or the smaller value between the first writing pressure value to which the first weight is applied and the second writing pressure value to which the second weight is applied as the third writing pressure value.

Figure 10:
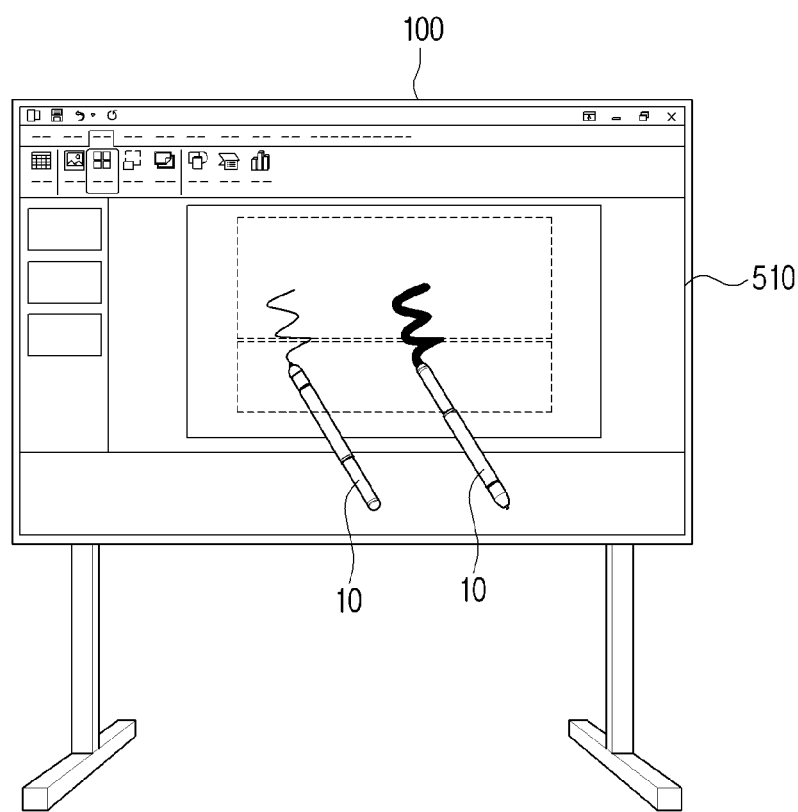
FIG. 10 is a diagram for illustrating a method for identifying a writing pressure value according to a touch size, according to one or more embodiments.

FIG. 10 is a diagram for illustrating a method for identifying a writing pressure value according to a touch size according to one or more embodiments.

According to one or more embodiments, the pen-tip on one side of the electronic pen 10 operating according to the passive method may be implemented as a thin pen-tip, and the pen-tip on the opposite side may be implemented as a relatively thick pen-tip.

According to one or more embodiments illustrated in FIG. 10, if a touch input is performed on one side of the electronic pen 10 (e.g., the thin pen-tip), a touch trajectory of thin thickness may be displayed, and if a touch input is performed on the opposite side of the electronic pen 10 (e.g., the thick pen-tip), a touch trajectory of thick thickness may be displayed. For example, in the case of the electronic pen 10 operating according to the passive method, a writing pressure value may be identified based on a touch size.

The embodiment illustrated in FIG. 10 is merely an example, and as understood by one of ordinary skill in the art, different writing pressure values may be applied according to touch areas in the case of other input objects such as a finger, etc.

Figure 11:
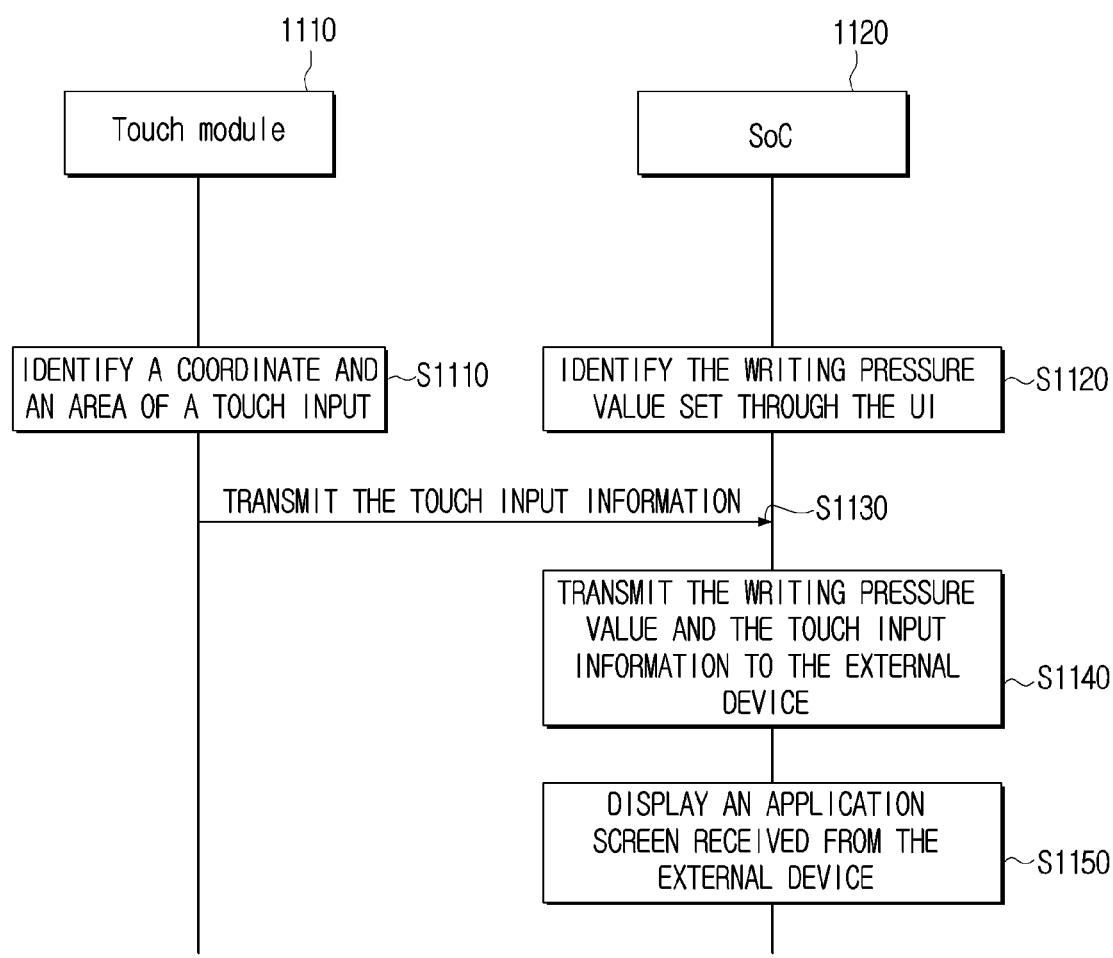
FIG. 11 is a diagram for illustrating an operation according to an implementation example of an electronic device, according to one or more embodiments.

FIG. 11 is a sequence diagram for illustrating an operation according to an implementation example of an electronic device according to one or more embodiments.

According to FIG. 11, the electronic devices 100 or 100' may include a touch module (or touch sensor) 1110 and an SoC 1120. The touch module 1110 may be provided in the display 110, and acquire various kinds of information related to a touch input. For example, the touch module 1110 may be implemented to detect a touch input by an infrared method, but is not limited thereto. The System on Chip (SoC) may be a chip that is in charge of overall control of the electronic devices 100, 100', and the chip may include, for example, various electronic components such as a microprocessor, a DSP, a RAM, a ROM, etc.

The SoC 1120 may identify a writing pressure value set through the writing pressure adjustment UI 520 in operation S1110. For example, if the location of the indicator included in the writing pressure adjustment bar is set, the SoC 1120 may identify a writing pressure value corresponding to the location of the indicator.

The touch module 1110 may identify touch input information including a touch coordinate and a touch area (or a touch size) corresponding to a touch input in operation S1120, and transmit the touch input information to the SoC 1120 in operation S1130. The touch input information may further include tilt information and writing pressure information other than the touch coordinate and the touch area. The writing pressure information may be a fixed value that was predetermined regarding the electronic pen 10 operating according to the passive method.

When the touch input information is received from the touch module 1110, the SoC 1120 may transmit the touch input information from the touch module 1110 and the writing pressure value set through the writing pressure adjustment UI 520 to the external device 200 in operation S1140. For example, in case a fixed writing pressure is included in the touch input information from the touch module 1110, the SoC 1120 may replace the writing pressure value by the writing pressure value set through the writing pressure adjustment UI 520, and transmit the value to the external device 200.

After this operation, the SoC 1120 may display an application screen received from the external device 200, i.e., an application screen including a touch trajectory. In this case, the touch trajectory included in the application screen may be a touch trajectory of thickness corresponding to the writing pressure value set through the writing pressure adjustment UI 520.

According to one or more embodiments, the electronic devices 100, 100' may set the writing pressure value based on a remote control signal, a user voice, a user motion, or any other input stimulus known to one of ordinary skill in the art. For example, if a remote control signal for decreasing or increasing the writing pressure value is received, the electronic devices 100, 100' may provide a guide UI corresponding to the adjusted writing pressure value. In this case, a user may recognize the set writing pressure value even if the writing pressure adjustment UI is not provided.

At least some of the components included in the aforementioned various embodiments and drawings can be combined with at least some of the components included in the other embodiments and the other drawings.

According to the aforementioned various embodiments, a writing input (or a drawing input) of thickness desired by a user may be provided even if an electronic pen that does not detect a writing pressure value is used. For example, in the case of an electronic board, there are many cases where the electronic board may be used by being connected to an external device such as a PC other than a writing application provided inside. As an electronic board is used a lot for meetings or education, there is very high frequency that the electronic board is connected with an external device, and applications for document works are used. In the case of such applications, writing pressures are supported in many cases, and in the case of a touch module, it does not directly measure a writing pressure. Accordingly, in the case of using a passive electronic pen, the writing pressure value is fixed to the set value, and a user cannot adjust the thickness. In this case, the thickness may be adjusted by adjusting the writing pressure value to the thickness desired by the user through the writing pressure adjustment UI. Furthermore, in the case of an IR touch module, it is possible to distinguish the thickness of an object. Accordingly, in the case of matching the touch size information with the writing pressure value and using a thin pen-tip, a touch input with thin thickness is possible. Furthermore, in the case of inputting with a thick object such as a marker, a touch input becomes possible in thick thickness.

The aforementioned various embodiments may also be applied to a projector system. For example, if the writing pressure value is adjusted through the writing pressure adjustment UI, the thickness of the laser point may be adjusted based on the value set through the writing pressure adjustment UI.

The methods according to the aforementioned various embodiments may be implemented in forms of applications that can be installed on conventional electronic devices. In one or more examples, at least some of the methods according to the aforementioned various embodiments of the disclosure may be performed by using a deep learning-based artificial intelligence model (e.g., a learning network model).

Furthermore, the methods according to the aforementioned various embodiments of the disclosure may be implemented with a software upgrade, or a hardware upgrade of conventional electronic devices.

Furthermore, the aforementioned various embodiments of the disclosure may also be performed through an embedded server provided on an electronic device, or an external server of an electronic device.

According to one or more embodiments of the disclosure, the aforementioned various embodiments may be implemented as software including instructions stored in machine-readable storage media, which can be read by machines (e.g.: computers). The machines refer to devices that call instructions stored in a storage medium, and may operate according to the called instructions, and the devices may include an electronic device according to the aforementioned embodiments (e.g., an electronic device A). In case an instruction is executed by a processor, the processor may perform a function corresponding to the instruction by itself, or by using other components under its control. An instruction may include a code that is generated or executed by a compiler or an interpreter. A storage medium that is readable by machines may be provided in the form of a non-transitory storage medium. The term 'non-transitory' may mean a storage medium does not include signals, and is tangible, but does not indicate whether data is stored in the storage medium semi-permanently or temporarily.

Furthermore, according to one or more embodiments of the disclosure, the methods according to the aforementioned various embodiments may be provided while being included in a computer program product. A computer program product refers to a product, and it can be traded between a seller and a buyer. A computer program product may be distributed in the form of a storage medium that is readable by machines (e.g., a compact disc read only memory (CD-ROM)), or distributed on-line through an application store (e.g., Play Store™). In the case of on-line distribution, at least a portion of a computer program product may be stored in a storage medium such as the server of the manufacturer, the server of the application store, and the memory of the relay server at least temporarily, or may be generated temporarily.

In addition, each of the components (e.g., a module or a program) according to the aforementioned various embodiments may be comprised of a single entity or a plurality of entities, and some sub-components among the aforementioned sub-components may be omitted, or other sub-components may be further included in the various embodiments. In one or more examples, some components (e.g., modules or programs) may be integrated into one entity to perform the same or similar functions performed by each component prior to integration. Operations performed by a module, a program, or other components, in accordance with the various embodiments, may be performed sequentially, in parallel, repetitively, or in a heuristic manner, or at least some operations may be performed in a different order, omitted, or a different operation may be added.

Further, while embodiments of the disclosure have been shown and described, the disclosure is not limited to the aforementioned embodiments, and it is apparent that various modifications may be made by those having ordinary skill in the technical field to which the disclosure belongs, without departing from the gist of the disclosure as claimed by the appended claims. Furthermore, it is intended that such modifications are not to be interpreted independently from the technical idea or prospect of the disclosure.

What is claimed is:

1. An electronic device for receiving and displaying an application screen from an external device, the electronic device comprising:
    a display including a touch sensor;
    a communication interface; and
    at least one processor configured to:
        control the display to display a first application screen received from the external device through the communication interface and a writing pressure adjustment user interface (UI),
        transmit, to the external device, information on a writing pressure value set through the writing pressure adjustment UI and a touch input identified through the touch sensor,
        receive, from the external device through the communication interface, a second application screen including a touch trajectory identified based on the information on the writing pressure value and the touch input, and
        control the display to display the received second application screen.

2. The electronic device of claim 1, wherein the writing pressure adjustment UI comprises a writing pressure adjustment bar configured to adjust a size of the writing pressure value, and
    wherein the at least one processor is further configured to:
        transmit information including the writing pressure value set by the writing pressure adjustment bar, and a touch coordinate and a touch size of the touch input identified through the touch sensor to the external device, and
        receive the second application screen including the touch trajectory of thickness corresponding to the writing pressure value from the external device.

3. The electronic device of claim 1, wherein the at least one processor is further configured to control the display to display a guide UI including thickness information corresponding to the writing pressure value set through the writing pressure adjustment UI.

4. The electronic device of claim 3, further comprising:
    a memory storing thickness information of touch trajectories according to writing pressure values corresponding to each of a plurality of applications,
    wherein the at least one processor is further configured to control the display to display the guide UI including the thickness information of the touch trajectories corresponding to each of the plurality of applications based on the set-set writing pressure values.

5. The electronic device of claim 1, wherein the at least one processor is further configured to, based on the touch input being identified in a separate area from the first application screen after the writing pressure value is set through the writing pressure adjustment UI, control the display to display the touch trajectory corresponding to the touch input based on thickness information identified based on the set writing pressure value.

6. The electronic device of claim 1, wherein the touch sensor comprises an infrared touch sensor, and
    wherein the at least one processor is further configured to:
        identify a writing pressure value corresponding to the touch input based on a touch size of the touch input detected by the infrared touch sensor, and
        transmit at least one of the writing pressure value set through the writing pressure adjustment UI or the writing pressure value identified based on the touch size to the external device.

7. The electronic device of claim 6, wherein the at least one processor is further configured to:
    adjust the writing pressure value set through the writing pressure adjustment UI based on the touch size, and
    transmit the adjusted writing pressure value to the external device.

8. The electronic device of claim 6, wherein the at least one processor is further configured to:
    apply a first weight to a first writing pressure value set through the writing pressure adjustment UI,
    apply a second weight to a second writing pressure value identified based on the touch size,
    identify a third writing pressure value based on the first writing pressure value to which the first weight is applied and the second writing pressure value to which the second weight is applied, and
    transmit the identified third writing pressure value to the external device.

9. The electronic device of claim 1, wherein the at least one processor is further configured to:
    based on the first application screen being provided to some areas of the display, provide the writing pressure adjustment UI to remaining areas of the display, and
    based on the first application screen being provided to entire areas of the display, provide the writing pressure adjustment UI to one area of the first application screen as a pop-up screen.

10. The electronic device of claim 1, wherein the touch input is input by a passive input device.

11. A method for controlling an electronic device for receiving and displaying an application screen from an external device, the method comprising:
    displaying a first application screen received from the external device and a writing pressure adjustment user interface (UI);
    transmitting, to the external device, information on a writing pressure value set through the writing pressure adjustment UI and a touch input identified through a touch sensor;
    receiving, from the external device, a second application screen including a touch trajectory identified based on the information on the writing pressure value and the touch input; and
    displaying the received second application screen.

12. The method of claim 11, wherein the writing pressure adjustment UI comprises a writing pressure adjustment bar configured to adjust a size of the writing pressure value,
- wherein the transmitting to the external device comprises transmitting information including the writing pressure value set by the writing pressure adjustment bar, and a touch coordinate and a touch size of the touch input identified through the touch sensor to the external device, and
- wherein the receiving the second application screen comprises receiving the second application screen including the touch trajectory of thickness corresponding to the writing pressure value from the external device.

13. The method of claim 11, further comprising:
- displaying a guide UI including thickness information corresponding to the writing pressure value set through the writing pressure adjustment UI.

14. The method of claim 13, wherein the displaying the guide UI comprises displaying the guide UI including thickness information of touch trajectories according to writing pressure values corresponding to each of a plurality of applications.

15. The method of claim 11, further comprising:
- based on the touch input being identified in a separate area from the first application screen after the writing pressure value is set through the writing pressure adjustment UI, displaying the touch trajectory corresponding to the touch input based on thickness information identified based on the set writing pressure value.

* * * * *